United States Patent
Aigner et al.

(10) Patent No.: US 7,096,572 B2
(45) Date of Patent: Aug. 29, 2006

(54) DEVICE FOR FITTING SUBSTRATES WITH ELECTRIC COMPONENTS

(75) Inventors: Sebastian Aigner, Iffeldorf (DE); Mohammad Mehdianpour, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 80 days.

(21) Appl. No.: 10/296,178

(22) PCT Filed: May 23, 2001

(86) PCT No.: PCT/DE01/01982

§ 371 (c)(1),
(2), (4) Date: Nov. 22, 2002

(87) PCT Pub. No.: WO01/91533

PCT Pub. Date: Nov. 29, 2001

(65) Prior Publication Data

US 2003/0121144 A1    Jul. 3, 2003

(30) Foreign Application Priority Data

May 23, 2000  (DE) ................................ 100 25 441

(51) Int. Cl.
*H05K 3/30* (2006.01)
(52) U.S. Cl. ............................. 29/740; 29/712; 29/743; 29/759; 29/832; 29/33 M; 29/DIG. 44
(58) Field of Classification Search .................. 29/740, 29/742, 743, 759, 834; 198/341; 294/64.1; 269/903; 414/737, 752
See application file for complete search history.

(56) References Cited

U.S. PATENT DOCUMENTS

| 4,747,198 | A | * | 5/1988 | Asai et al. ................ 29/407.04 |
| 5,203,061 | A | * | 4/1993 | Hamada .................... 29/33 M |
| 5,255,429 | A |   | 10/1993 | Nishi et al. |
| 5,369,493 | A | * | 11/1994 | Tomita et al. .............. 356/400 |
| 5,711,065 | A |   | 1/1998 | Asai et al. |
| 5,749,142 | A | * | 5/1998 | Hanamura ................... 29/833 |
| 5,778,525 | A | * | 7/1998 | Hata et al. .................... 29/836 |
| 5,880,849 | A | * | 3/1999 | Van De Ven .............. 356/399 |
| 6,347,442 | B1 | * | 2/2002 | Hwang ....................... 29/281.4 |
| 6,568,069 | B1 | * | 5/2003 | Melf et al. .................... 29/740 |

FOREIGN PATENT DOCUMENTS

| DE | 36 30 178 | 3/1988 |
| WO | 98/37744 | 8/1998 |

* cited by examiner

*Primary Examiner*—Minh Trinh
(74) *Attorney, Agent, or Firm*—Harness, Dickey & Pierce, P.L.C.

(57) ABSTRACT

The inventive device comprises a positioning device (4) for a fitting head (14). The positioning device is anchored on a support (3), which is detachably fastened to a supporting body (2) of the inventive device. A control device (17) for the positioning device (4) is additionally fastened to the support. These functional parts form a completely operative functional unit, which can be separately tested, calibrated and supplied by the supporting body (2). Different supports (3, 23) for different positioning devices (4, 20) can be fastened to the supporting body (2), whereby the inventive device can be optimally adapted to perform different fitting tasks.

15 Claims, 2 Drawing Sheets

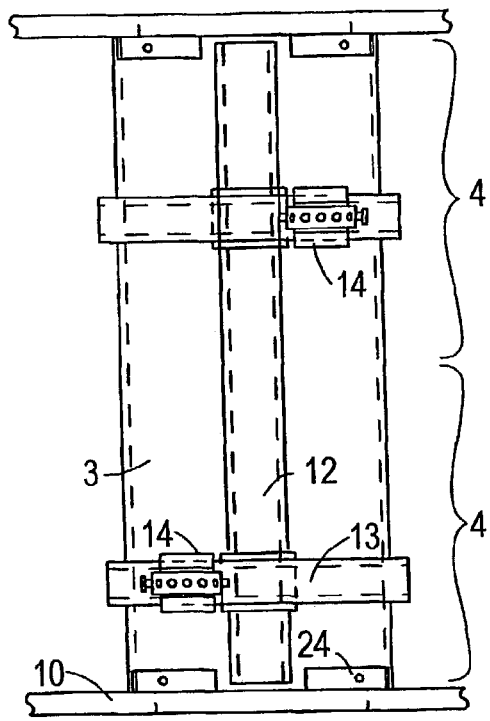
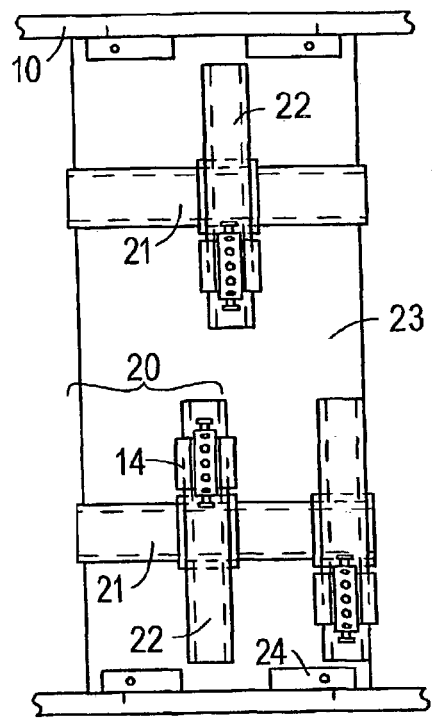
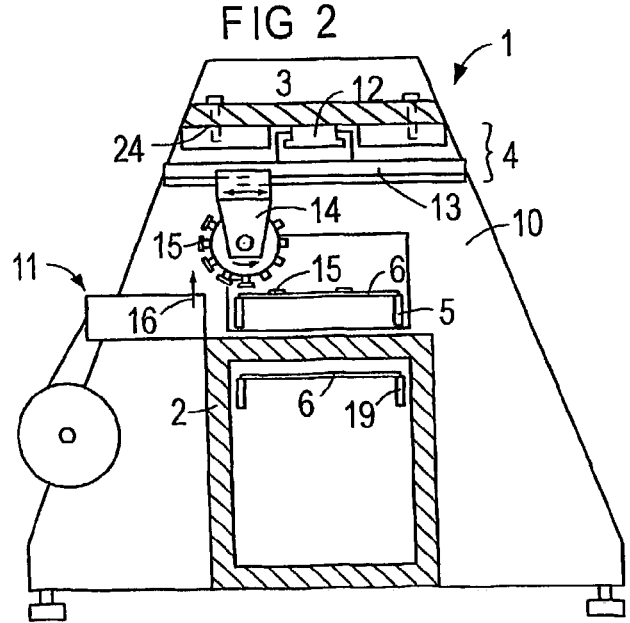
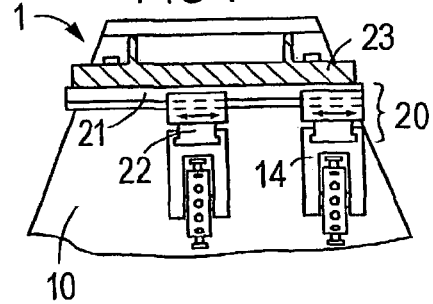

DEVICE FOR FITTING SUBSTRATES WITH ELECTRIC COMPONENTS

This application is the national phase under 35 U.S.C. § 371 of PCT International Application No. PCT/DE01/01982 which has an International filing date of May 23, 2001, which designated the United States of America and which claims priority on German patent application number 10025441.1 filed May 23, 2000, the entire contents of which are hereby incorporated herein by reference.

FIELD OF THE INVENTION

The invention generally relates to a device for fitting substrates with electric components by using at least one fitting head for handling the components.

BACKGROUND OF THE INVENTION

A device has been disclosed, for example, by WO 98/37744 A1. According to that document, the fitting head can be moved in a working plane by use of an X-Y positioning device. The positioning device comprises a stationary longitudinal guide and a transverse positioning arm displaceably mounted thereon, along which the fitting head is displaceably mounted. The stationary longitudinal guide is formed on a beam-like carrier, which extends along one side of the working plane.

A conveying path for the substrates is led through the device. The conveying path is used in one sub-area as a fitting station, in which the substrates are fixed to be fitted. The travel range covers the fitting area and the collecting points for the components, which are removed from feed devices by use of the fitting head and are placed on the substrate. In particular during placement of the components, very high requirements on the accuracy must be met.

It is usual to finish the fitting devices completely at the manufacturer and to test them. These tests include, inter alia, calibration with the determination of the offset values in the positioning of the fitting head in the various sub-areas of the fitting area. These offset values are stored in the control devices of the fitting device and taken into account with an appropriate correction step during each subsequent fitting operation. The control devices are normally held in a chassis of the fitting device and connected to the positioning device by cables. In the event of replacement of the positioning device or even only parts thereof, the machine has to be completely remeasured in order to redetermine the appropriate offset values. Performing such a recalibration of the device at the point of use can be associated with problems if the corresponding measuring equipment is lacking there.

DE 36 30 178 A1 discloses a fitting device in which functional units are joined together in modular fashion to form a mounting device, the functional units having their own chassis, which are clamped to one another in the manner of flanges by means of connecting elements. For example, a mounting station with its own stand and an X-Y positioning system is coupled to a transport station, the mounting station being provided with its own control electronics. Modern fitting technology with extremely high performance rates and extremely high accuracy requirements assumes a particularly dimensionally rigid and low-oscillation supporting construction, which cannot be achieved with the individual modules erected on the floor, whose oscillatory behavior additionally remains undefined.

SUMMARY OF THE INVENTION

An embodiment of the invention may be based on an object of reducing the effort on manufacture, testing and calibration.

By separating the chassis into a simple supporting body and the self-supporting carrier for the positioning device, it is possible to manufacture, to test and to supply the carrier separately from the chassis. The carrier here represents the actual robot, which is fully serviceable on its own. This makes it possible, for example in the event of damage to the positioning device, to remove this in the short term with the carrier and to replace it by a new fully serviceable, calibrated and tested functional unit.

As a result of the logical separation of supporting body and functional unit, it is possible to test and calibrate all the functional units in a testing device without it being necessary to transport the supporting body into these rooms, which means that the entire sequence is simplified. The defined supporting points of the chassis are simulated in the testing device, so that the test results can readily be transferred to the fitting device. Assigning the data carrier to the functional unit ensures that the characteristic data cannot be confused with those from other functional units.

It is also possible to transport the supporting body and the functional unit separately. For example, the chassis can be transported to the point of use in advance on the land or sea route, can be erected there and anchored. The expensive functional unit with the carrier and the positioning device and the fitting head is so light that it can subsequently be supplied in a short time, for example by aircraft, and can be installed.

A delivery unit permits complete integration of the individual components, which can provided in particular by a permanent assignment of the data carrier to the control unit.

By a development, the functional unit can become a completely autonomous module, to which only the supply lines then have to be connected.

Another development makes it possible to mount different fitting heads on the positioning arm without the positioning unit having to be recalibrated.

plate-like carrier can represent a large-area mounting platform for the positioning device. As a result of the two-dimensional extent and as a result of the support, oscillations caused by the travel movement of the fitting head are kept small. In addition, the arrangement above the fitting station results in short, flexurally rigid lever arms. Another plate-like design of the carrier can permit the arrangement of one or more positioning device in a different configuration, so that the functional unit can be adapted optimally to the respective intended use.

It is also possible to insert different functional units with different positioning devices and different supports matched thereto into the supporting body.

Other developments permit high positioning accuracy and short travel paths with short displacement paths of the fitting head.

Another arrangement can make it possible to permit access to both feed sides with one positioning device. In this case, the center of the guides is located above the fitting station, which increases the fitting accuracy. It is possible to provide two fitting stations each having a positioning device in the conveying path. Accordingly, feed devices for the components are arranged on both sides of both fitting stations, so that the multiplicity of components provided is increased accordingly.

Another development indicates that the fitting performance can be increased, by the two fitting heads alternately picking up components at the collecting point and placing them on the substrate. Here, too, an additional fitting station with additional components can be provided.

As a result of another development, a supporting plane for the carrier is provided which, in one setting of a milling device, for example, can be machined on the supporting body or on the carrier. A precise association between the positioning device and the substrate is achieved in use by the position of centering marks on the substrate being measured by means of a camera fitted to the fitting head and being taken into account accordingly during the fitting operation. The feed devices for the components likewise have centering marks, which are measured in a similar way. As a result, following the installation of the carrier in the supporting body, no further centering measures are needed.

BRIEF DESCRIPTION OF THE DRAWINGS

The invention will be explained in more detail in the following text using exemplary embodiments illustrated in the drawings, in which:

FIG. 2 shows a partial section through the device according to FIG. 1, FIG. 3 shows a plan view of the parts according to FIG. 2, FIG. 4 shows a partial section through a modified device according to FIG. 1, FIG. 5 shows a plan view of the parts according to FIG. 4.

DETAILED DESCRIPTION OF THE PREFERRED EMBODIMENTS

Figure 1:
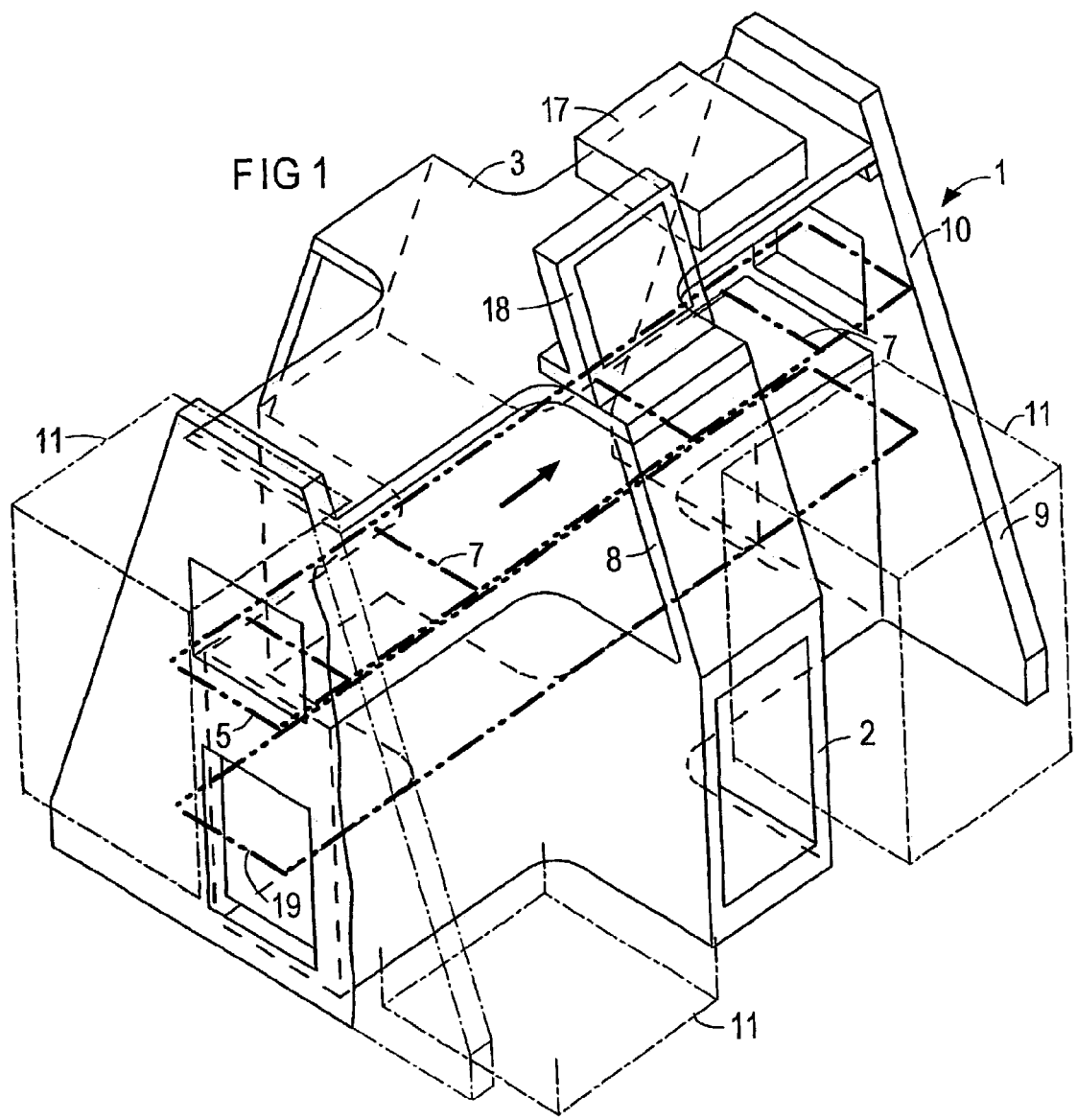
FIG. 1 shows a schematic perspective view of a device for fitting substrates with electric components.

According to FIGS. 1, 2 and 3, a chassis 1 of a device for fitting substrates 6 with electric components 15 comprises a cast supporting body 2 and a plate-like carrier 3 which is fixed thereto and on which an X-Y positioning device 4 is mounted. Above the supporting body 2, a conveying path 5 for the substrates 6 is led through the device, it being possible for said substrates 6 to be fitted with the components in fitting stations 7 belonging to the conveying path 5.

In plan view, the supporting body 2 has a cross-like structure, in which a main leg extends parallel to the conveying path 5 and underneath the latter. A central leg extends transversely with respect to the transport direction in the central area of the main leg. Cast at its ends are wall-like central supports 8 projecting upward for the carrier 3. Provided at the ends of the main legs are end walls 9 attached in one piece, which are widened above the supporting body 2 to form end supports 10 for the carrier 3. In the corner regions between the legs of the supporting body 2 there are arranged spaces for feed devices 11 for the components to be fitted. The upper sides of the feed devices 11 are located at the same vertical level as the substrate 6.

The plate-like carrier 3 is arranged at a distance above the conveying path 5. Mounted on its underside is the positioning device 4, which comprises a longitudinal guide 12 which is fixed to the underside of the carrier 3 and extends in the conveying direction and a positioning arm 13 which is transverse thereto and is displaceably mounted in the longitudinal guide 12. The latter is provided with magnetic parts, for example, which, together with a coil part belonging to the positioning arm 13, form a linear motor which drives the positioning arm.

On the underside of the positioning arm 13, a turret-like fitting head 14 is displaceably mounted, using which the components 15 can be transported from collecting stations 16 of the feed devices 11 to their placement locations on the substrate. The central supports 8 are so wide and flexurally rigid in the conveying direction that they effectively prevent oscillations caused by the movement of the positioning arm. Pulses triggered in the transverse direction by the movement of the fitting head are effectively prevented by the end supports. In order to achieve the greatest possible fitting performance, it is expedient to allocate a dedicated positioning device 4 for each fitting station.

Provided on the upper side of the carrier 3 are spaces for auxiliary devices, for example in the form of a control device 17 and a display 18. The supporting body 2 is formed as a cast hollow body, through whose main leg an additional transport path 19 for the substrates 6 is led. This conveying path is used, for example, to lock substrates past the fitting stations. The cavities in the central secondary legs can, for example, be used for the purpose of accommodating power supply units, pneumatic equipment or further control devices.

The device according to FIGS. 4 and 5 differs from that according to FIGS. 2 and 3 in the arrangement of the positioning axes. The modified longitudinal guides 21 here extend transversely with respect to the conveying direction of the substrates over each of the fitting stations and are fixed to a modified carrier 23 reinforced by ribs. Two modified positioning arms 22 each having one of the fitting heads 14 can be moved on the longitudinal guide 21. These form two positioning devices 20, which can alternately collect components and place them on the substrate, as a result of which the fitting performance is considerably increased. The end walls 10 are provided with supporting points 24 lying in one plane for the defined support of the carrier 23.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A device for fitting substrates with electric components by use of at least one fitting head for handling the components, wherein the fitting head is moveable in two coordinate directions using at least one positioning device, the device comprising:

a chassis, having stationary parts of the positioning device anchored thereto, and including,
a substantially passive supporting body, and
a single removable self-supporting carrier at least partly extending above a conveying path for the substrates, the carrier being attachable to the supporting body such that the carrier is stationary relative to the supporting body, and the carrier having the stationary parts of the positioning device fixed thereto, wherein
the supporting body includes supporting points for the carrier,
the carrier and the positioning device form a removable unit detachable from the supporting body, and
the positioning device includes a longitudinal guide fixed to the carrier and at least one transverse positioning arm displaceably mounted on the longitudinal guide and on which the fitting head is displaceably mounted.

2. The device as claimed in claim 1, wherein the removable unit is combinable with a data carrier to form a common delivery unit.

3. The device as claimed in claim 2, wherein the data carrier is part of a control device for the positioning device.

4. The device as claimed in claim 3, wherein the control device is fixable to the carrier.

5. The device as claimed in claim 1, wherein different fitting heads are attachable to the positioning device, and wherein the fitting heads are provided with a memory for head-specific characteristic data.

6. The device as claimed in claim 1, wherein the carrier is arranged above at least one fitting station for the substrates, and wherein the supporting body is provided, at the side of the travel area of the positioning device, with upwardly projecting supports for the carrier, and wherein the positioning device is arranged on the underside of the carrier.

7. The device as claimed in claim 1, wherein different positioning devices are fixable to the carrier.

8. The device as claimed in claim 7, wherein the positioning devices is fixable to the carrier in a different configuration.

9. The device as claimed in claim 1, wherein for different positioning devices, different carriers are fixable to the supporting body.

10. The device as claimed in claim 1, wherein a fitting station lies in a conveying path for the substrates, and wherein, at the side of the transport path, spaces for feed devices for the components are provided.

11. The device as claimed in claim 10, wherein the longitudinal guide extends over the fitting station and transversely with respect to the conveying path, and wherein two positioning arms, movable independently of each other, are movable on the longitudinal guide.

12. The device as claimed in claim 10, wherein the longitudinal guide extends centrally over the conveying path, parallel to the conveying path, and wherein the positioning arm projects on both sides until beyond collecting spaces of the two feed devices.

13. The device as claimed in claim 12, wherein the longitudinal guide extends over the fitting station and transversely with respect to the conveying path, and wherein two transverse positioning arms, movable independently of each other, are movable on the longitudinal guide.

14. The device as claimed in claim 1, wherein the supporting points for supporting the carrier on the supporting body are formed by horizontal supporting surfaces, which all lie in one plane.

15. The device as claimed in claim 1, wherein the longitudinal guide extends centrally over the conveying path, parallel to the conveying path, and wherein the positioning arm projects on both sides until beyond collecting spaces of two feed devices.

* * * * *